(12) United States Patent
Yoshimura et al.

(10) Patent No.: US 8,796,076 B2
(45) Date of Patent: Aug. 5, 2014

(54) STACKED SEMICONDUCTOR DEVICES AND FABRICATION METHOD/EQUIPMENT FOR THE SAME

(75) Inventors: Atsushi Yoshimura, Mie-ken (JP); Shoko Omizo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,153

(22) Filed: Aug. 30, 2012

(65) Prior Publication Data

US 2013/0062782 A1   Mar. 14, 2013

(30) Foreign Application Priority Data

Sep. 1, 2011   (JP) ................. P2011-190810

(51) Int. Cl.
*H01L 21/00*   (2006.01)
*H01L 21/30*   (2006.01)

(52) U.S. Cl.
USPC .......... 438/118; 438/106; 438/107; 438/109; 438/458; 438/459

(58) Field of Classification Search
USPC ......... 438/106, 107, 109, 118, 455, 458, 459, 438/460, 462, 464, 465
See application file for complete search history.

(56) References Cited

U.S. PATENT DOCUMENTS

| | | | | |
|---|---|---|---|---|
| 6,476,151 | B1* | 11/2002 | Araki et al. | 525/276 |
| 2003/0153127 | A1* | 8/2003 | Wada et al. | 438/118 |
| 2005/0268457 | A1* | 12/2005 | Ebihara et al. | 29/740 |
| 2007/0196952 | A1* | 8/2007 | Yoshimura et al. | 438/108 |
| 2012/0199993 | A1* | 8/2012 | Yoshimura et al. | 257/798 |

FOREIGN PATENT DOCUMENTS

| | | |
|---|---|---|
| JP | B6-20092 | 3/1994 |
| JP | 2002-246539 | 8/2002 |
| JP | 2004-229996 A | 8/2004 |
| JP | 2005-243910 A | 9/2005 |
| JP | 2006-114757 | 4/2006 |
| JP | 2010-050480 | 3/2010 |
| JP | 2010-077389 A | 4/2010 |

OTHER PUBLICATIONS

English Translation of Japanese Office Action; Japanese Patent Application No. 2011-190810; Dated Jan. 7, 2014.

* cited by examiner

*Primary Examiner* — Chuong A Luu
*Assistant Examiner* — Cory Eskridge
(74) *Attorney, Agent, or Firm* — Patterson & Sheridan, LLP

(57) ABSTRACT

After formation of an opening by exposing and development of the photosensitive surface protection film and adhesive layer which is formed on the circuit side of the semiconductor wafer, the semiconductor chips having a photosensitive surface protection film and adhesive layer thereon is fabricated by cutting individual chips from the semiconductor wafer. After the second semiconductor chip is placed over the first semiconductor chip up by the suction collet, the second semiconductor chip is bonded with the first semiconductor chip by the first surface protection film and adhesive layer. The suction side of the suction collet has lower adhesion to the second semiconductor chip than that between the now bonded semiconductor chips.

15 Claims, 8 Drawing Sheets

US 8,796,076 B2

STACKED SEMICONDUCTOR DEVICES AND FABRICATION METHOD/EQUIPMENT FOR THE SAME

CROSS-REFERENCE TO RELATED APPLICATION

This application is based upon and claims the benefit of priority from Japanese Patent Application No. 2011-190810, filed Sep. 1, 2011; the entire contents of which are incorporated herein by reference.

FIELD

Embodiments described herein relate to stacked semiconductor devices and the method/equipment for fabricating the same.

BACKGROUND

In recent years, a multiplicity of semiconductor chips are being stacked in one package and the encapsulated stacked multi-chip package has been put into practice to achieve miniaturization and high density implementation of semiconductor devices. The stacked semiconductor device, such as a stacked multi-chip package, is configured by stacking a multiplicity of semiconductor chips on a circuit substrate such as the wiring board or a lead frame in sequence. The semiconductor chip is commonly stacked by using an adhesive layer located on the non-circuit side (back side) which is the opposite side of the circuit side (surface) of the semiconductor chip.

In this case, since a surface protection film on the circuit side of the semiconductor chip, and an adhesive layer on the non-circuit side of the semiconductor chip, are required, it is inevitable that the stacked multiplicity of semiconductor chips, surface protection films and adhesive layers will combine to result in a thicker stack. As a countermeasure to this issue, there are proposals for formation of a surface protection film and adhesive layer combining the function of the surface protection film and adhesive layer and stacking the semiconductor chips by using this surface protection film and adhesive layer. Where the surface protection film and adhesive layer are formed as a single layer, the process of creating the protective film and adhesive film can be done in a single step, which contributes to the reduction of stacked semiconductor device thickness and the fabrication cost. However, the combined surface protecting and adhesive layers have resulted in fabrication issues when stacking two of more chips in a package.

In the case of using the surface protection film and adhesive layer, for example, after forming the surface protection film and adhesive layer on the surface of the semiconductor wafer, the semiconductor chip, having the surface protection film and adhesive layer formed thereon is cut from the semiconductor wafer. As the common package stacking process is employed in the process of stacking the semiconductor chips by picking up and stacking the semiconductor chips in a sequence, which ensures reliability of the adhesion between the semiconductor chips but also prevents separation of the semiconductor chips from the suction collet when picking up the semiconductor chips. Thus, attempts at using a combined surface protection and adhesive material have not met with success.

DETAILED DESCRIPTION

In general, according to one embodiment, the fabrication method of stacked semiconductor devices in the embodiment is described with reference of the diagrams.

According to the embodiment, there is provided a stacked semiconductor device and a methods and equipment for fabricating the same, in which a combined, single, surface protection film and adhesive layer is used on the stack of the semiconductor chips to enable adhesion reliability between the semiconductor chips and also limit the incidence of defects caused by the separation of the semiconductor chips and the suction collet.

The fabrication method of stacked semiconductor devices having multiple chip areas and dicing areas where multiple chip areas are being divided, includes forming a surface protection and adhesive layer onto the circuit side of a semiconductor wafer where the respective electrode pads are formed on the circuit side of the multiplicity of chip areas. The method also includes forming an opening which allows exposure of the electrode pad and dicing area on the surface protection adhesive layer by exposing and developing the surface protection and adhesive layer. The method includes partitioning the semiconductor wafer into a multiplicity of individual chips and positioning the non-circuit side of the semiconductor wafer on a support sheet. The method includes holding a first semiconductor chip on a suction collet and removing the chip from the support sheet, positioning the chip on a receiving substrate via the surface protection and adhesive layer thereon spaced from the receiving substrate, heating the receiving substrate and bonding the first semiconductor chip onto the receiving substrate. The method includes holding a second semiconductor chip on a suction collet and removing the chip on from the support sheet, positioning the second semiconductor chip onto the protection and adhesive layer of the first semiconductor chip, and bonding the first semiconductor chip to the second semiconductor chip. The suction collet has a suction side with lower adhesion to the surface protection and adhesive layer than that between the first semiconductor chip and the second semiconductor chip.

(Embodiment 1)

Figure 2A:
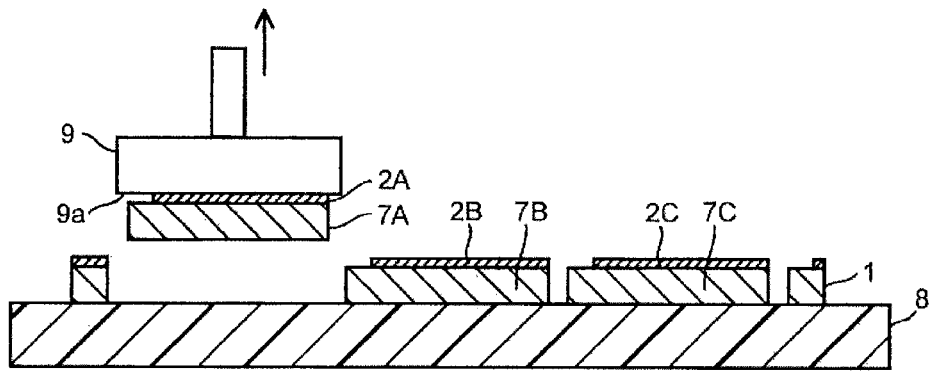
FIGS. 2A to 2C are side views, depicting the processes for forming a stack of chips starting from picking up a first singulated semiconductor chip to adhesion of a second semiconductor chip thereon in the fabrication method of the stacked semiconductor device in the first embodiment.
Figure 2B:
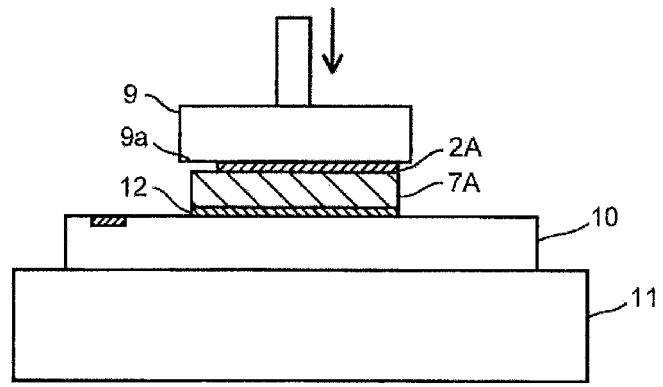
Figure 2C:
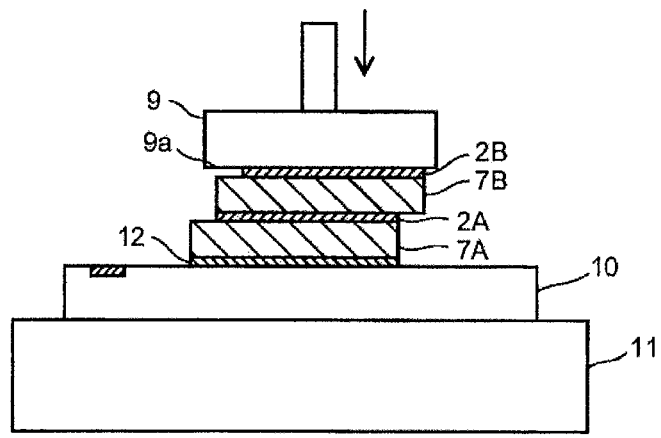
Figure 3:
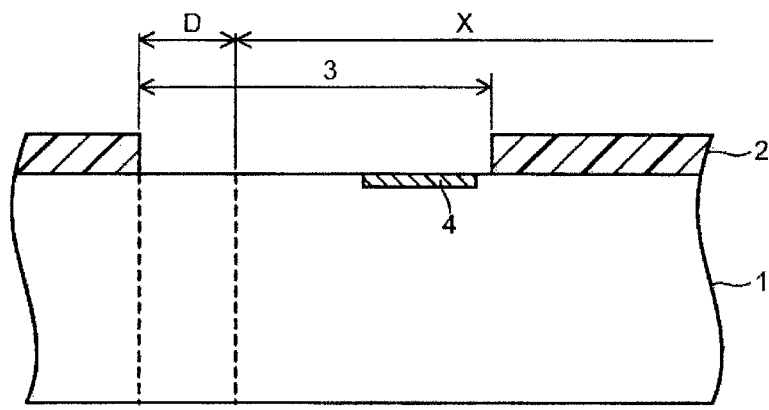
FIG. 3 is an enlarged cross section of a portion of adjacent chips on a wafer to be singulated therefrom, showing the details of the dicing area of the semiconductor wafer wherein individual chips are singulated from a wafer and are used in the fabrication method of the stacked semiconductor device shown, for example, in FIG. 4.
Figure 4:
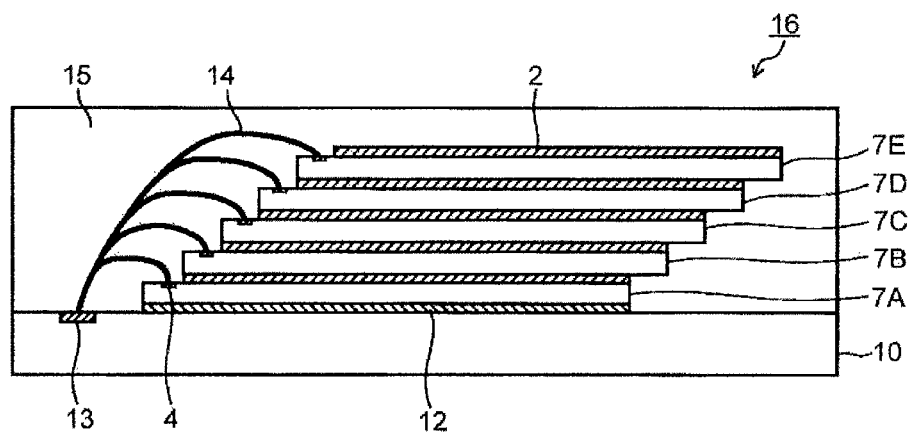
FIG. 4 is a cross section depicting a semiconductor package fabricated by employing the fabrication method of the stacked semiconductor device according to the first embodiment.

FIGS. 1A to 1F are diagrams depicting the processes from formation of a single, combined, surface protection film and adhesive layer on a wafer to singulation of the semiconductor wafer into individual chips, reading for stacking, in the fabrication method of the stacked semiconductor device in the first embodiment. FIGS. 2A to 2C are diagrams depicting the processes from picking up a first semiconductor chip to the adhesion of a second semiconductor chip thereon in the fabrication method of the stacked semiconductor device in the first embodiment. FIG. 3 is a partial view of an enlarged portion of a wafer showing adjacent chips to be singulated therefrom and the dicing area of the semiconductor wafer used in the fabrication method of the stacked semiconductor device shown in FIG. 4. FIG. 4 is a diagram depicting a semiconductor package fabricated by employing the fabrication method of the stacked semiconductor device according to the first embodiment.

Figure 1A:
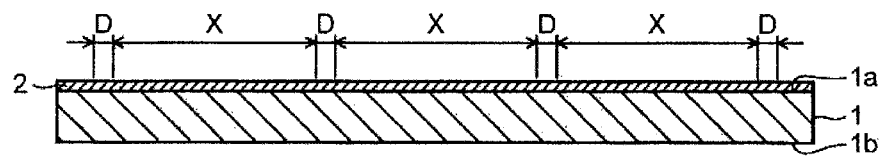
FIGS. 1A to 1F are cross sectional views of a portion of a wafer, depicting the processes of formation of a surface protection film and adhesive layer on the wafer, the singulation of those chips from the wafer being held on a support, and ending in FIG. 1F with the positioning of the individual, singulated, chips on a support for further processing thereof into a stacked semiconductor device in the first embodiment.

To form a stacked chip device of the embodiment, first, as shown in FIG. 1A, a combined surface protection film and adhesive layer 2, having photosensitivity, is formed on the circuit side (surface) of the semiconductor wafer 1. The combined surface protection film and adhesive layer 2 is uniformly formed over the entire surface of the circuit side 1a of the semiconductor wafer 1. The semiconductor wafer 1 has multiple chip areas X, and semiconductor devices (not shown) having semiconductor circuits and wiring or circuit layers, etc. formed on the circuit side 1a of each chip area X. To singulate the chips from the wafer 1, respective dicing areas D are arranged between multiple chip areas X. As described with respect to the following FIGS. 1B to 1F, the semiconductor wafer 1 is cut along the dicing area D. By cutting the semiconductor wafer 1, and then thinning the back side, i.e., non-device side, of the wafer 1 such as by grinding to the depth of the cut portions, the chips are partitioned such that multiple semiconductor chips equivalent to multiple chip areas X are fabricated from the wafer.

The combined surface protection film and adhesive layer 2 protects the circuit side (surface) of chip area X during cutting of the wafer and picking and placing of individual chips into a package, and also functions as the adhesive to secure the stacked semiconductor chips to one another. Since the combined surface protection film and adhesive layer 2 is photosensitive, patterning by the exposure and development process becomes possible. Thermosetting resins, such as phenol resin or polyimide resin, have adhesion properties that enable adhesion between the semiconductor chips, and also have photosensitivity that enables an exposure and development process on the combined surface protection film and adhesive layer 2. It is also acceptable that the combined surface protection film and adhesive layer 2 be formed with a thermoplastic resin having photosensitivity.

The combined surface protection film and adhesive layer 2 of the embodiment is formed by coating a resin composition (photosensitive adhesive resin composition) having photosensitivity and bonding properties on the circuit side 1a of the semiconductor wafer 1 by inkjet or spin coating or other methods, then allowing the coating film of the resin composition to dry. Suitable materials for formation of the combined surface protection film and adhesive layer 2 include, for example, a resin composition containing a phenol resin of 20 to 40% by weight, a photosensitizer of 10% by weight or less, a surface-active agent of 10% by weight or less, and a resin composition containing a solvent of 30 to 80% by weight, and/or a phenol resin of 30 to 80% by weight, a photosensitizer 10% by weight or less, and a cross-linking agent of 20 to 40% by weight, and a surface-active agent of 10% by weight or less.

It is preferable that the viscosity of the photosensitive adhesive resin composition (the viscosity at the time of coating) be 1 Pa·s or less (at 25° C.), when forming the surface protection film and the adhesive layer 2. However, depending on the method of coating the photosensitive adhesive resin composition, by using a photosensitive adhesive resin composition of 1 Pa·s or less viscosity (liquid composition) at 25° C., the formation of the combined surface protection film and adhesive layer 2 is improved, and the occurrence of voids and the like in the film layer can be reduced to minimal levels. The viscosity of the liquid resin composition is assumed to have the indicated value measured by the B-type viscometer (JIS K711 7-2). The amount of the volatile elements residue in the combined surface protection film and adhesive layer 2 after drying is preferably below 30% by weight, and more preferably is below 15% by weight. Voids in the surface protection film and adhesive layer 2 are also controlled because of this, and the generation of unevenness of the film thickness when coming into contact with the exposure mask is also reduced.

Figure 1B:
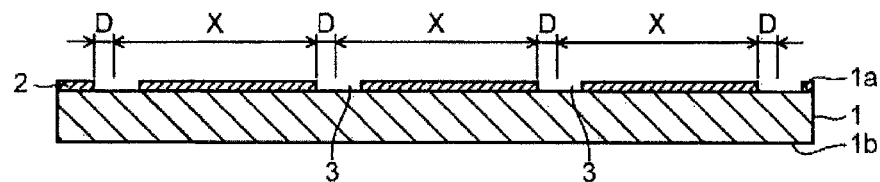

Next, as shown in FIG. 1B, after exposing the surface combined protection film and adhesive layer 2 by using a photomask (not shown) having a desired pattern, an opening 3 is formed in the combined surface protection film and adhesive layer 2 by the development processing procedure with a developer according to the type of the combined surface protection film and adhesive layer 2. The combined surface protection film and adhesive layer 2 with photosensitivity may be the negative type or the positive type of photosensitive material. When a positive type of combined surface protection film and adhesive layer 2 material is used, it functions as a layer after exposure after development thereof.

Moreover, when applying the thermosetting resin as the combined surface protection film and adhesive layer 2, it is preferable that it is prepared in a semi-setting state (the state of B stage) by thermal treatment (for example, at 120° C. for 1 hour) before the cutting of the semiconductor wafer 1.

After curing and developing, the opening 3 is exposed overlying the he dicing area D of the semiconductor wafer 1. Additionally, the opening is sized to also expose the electrode pad 4 provided on the circuit side of the chip area X of each chip as shown in FIG. 3. The electrode pad 4 is used to form a connection between each of the chips or the lead frame and the wiring boards. Therefore, the opening 3 is formed where the electrode pad 4 is exposed in addition to the dicing area D on the combined surface protection film and adhesive layer 2. The electrode pad 4 is disposed along one of the outer edges of the semiconductor chip based on the chip area X.

In the fabrication process in this embodiment, since the surface protection film and adhesive layer 2 used herein has the property of photosensitivity, after forming the surface protection film and adhesive layer 2 over the entire surface of the semiconductor wafer 1 having multiple chip areas X, the dicing area D and the electrode pad 4 is exposed (the overlying combined surface protection and adhesive film is locally removed thereover) by forming an opening 3 during the exposure and development process.

By exposing the dicing area D on the wafer 1 while the remainder of the wafer is covered with the photosensitive material, the occurrence of clogging of the dicing blade and chipping and defects caused by scattering of the resin in the post-processing of cutting the semiconductor wafer 1, can be controlled. Furthermore, by exposing the electrode pad 4, the later procedure of electrically connecting with the circuit substrate can be stably executed.

Figure 1C:
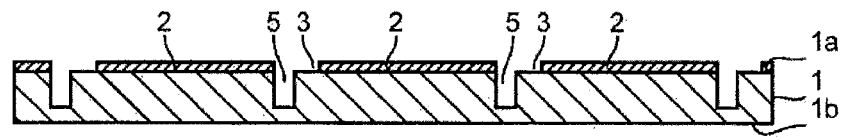

Next, a ditch 5 is formed to the semiconductor wafer 1 from the circuit side 1a as shown in FIG. 1C. The ditch 5 is formed by cutting within the dicing area D where the combined surface protection film and adhesive layer 2 was removed to form the opening 3, with a blade having a thickness slightly smaller, or equal to, the ditch 5 width. The depth of the ditch 5 is set shallower than the thickness of the semiconductor wafer 1 and deeper than the thickness of the finished semiconductor chip. The ditch 5 is thus formed to yield a chip 2 which is approximately half-cut into the semiconductor wafer 1. It is also acceptable to form the ditch 5 by etching and other methods. By formation of the ditch 5 (dicing ditch) into the semiconductor wafer 1 in such a degree of depth, multiple chip areas X are divided in the state corresponding to the thickness of the respective finished semiconductor chip.

Figure 1D:
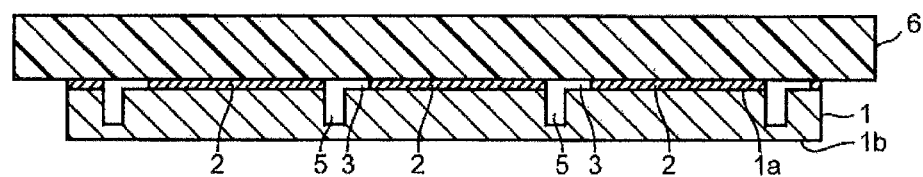

As shown in FIG. 1D, a protection tape 6 is adhered to the combined surface protection film and adhesive layer 2 on the circuit side (surface) 1a of the semiconductor wafer 1 after the dicing ditch 5 in the half-cut state is formed. The protection tape 6 protects the circuit side 1a of the semiconductor wafer 1 at the time of grinding the non-circuit side 1b of the semiconductor wafer 1 (back) by the further-processing. The shape of the semiconductor wafer 1 (wafer shape) after partitioning the chip area X in the non-circuit side 1b of grinding process is maintained. Various resin tapes can be used as the protection tape 6.

Figure 1E:
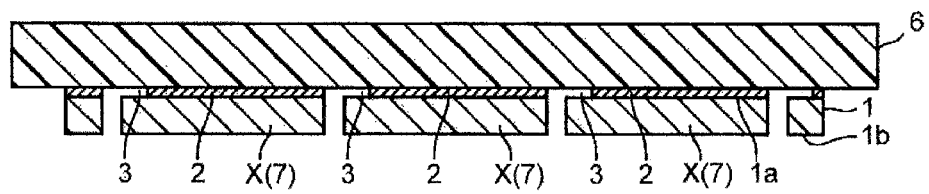

Next, the non-circuit side (back) 1b of the semiconductor wafer 1 held by the protection tape 6 as shown in FIG. 1E is ground and polished. The non-circuit side 1b of the semiconductor wafer 1 is mechanically ground by using a wrapping board, for instance. Then a grinding board (for instance, dry polishing) is used for polishing. The grinding and polishing process of the non-circuit side 1b of the semiconductor wafer 1 are executed to cause the back or the non-circuit side of the wafer to reach to the dicing ditch 5 formed on the circuit side 1a. Thus, each chip area X is divided and partitioned by grinding the non-circuit side 1b of the semiconductor wafer 1 to the depth of the ditch 5.

As a result of the grinding and polishing steps, multiple chip areas X are partitioned one from another as shown in FIG. 1E, as a result, multiple semiconductor chips 7 are fabricated from the wafer 1. Moreover, since the entire shape of the semiconductor wafer 1 is maintained by the protection tape 6, the shape of the wafer is maintained. For assembly into a stacked package or device, the combined surface protection film and adhesive layer 2 of each chip 7 needs to be accessible to the next chip in the stack. Once the singulated wafer is placed onto a support sheet, each chip is finally singulated by peeling the protective tape 6 off the wafer 1.

Figure 1F:
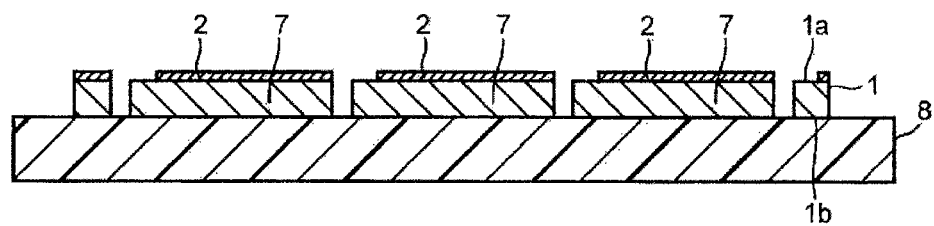

As showing in FIG. 1F, the shape of the wafer of multiple semiconductor chips 7 is retained by the support sheet 8 adhered on the non-circuit side 1b of the semiconductor wafer 1. The singulated semiconductor wafer 1 having multiple semiconductor chips 7, and having its shape retained by the support sheet 8 as a whole, is than carried to the pickup process in the next procedure. For instance, the UV curing type of adhesive tape is used as the support sheet 8. The UV curing type of adhesive tape is a tape that is formed with an adhesive layer (including the UV curing type of resin) onto a substrate sheet including a polyolefin resin and a polyvinyl chloride resin, etc. such as the polyethylenes and the polypropylenes as an example.

FIGS. 1C to 1F show the dicing process for the semiconductor wafer 1 which is referred to as the cutting process in the above. The cutting procedure of the semiconductor wafer 1 is not limited to the dicing process, as the normal dicing process can also be applied. That is, the support sheet that combines the function as a dicing tape is adhered on the non-circuit side 2b of the semiconductor wafer 1 (FIG. 1B) where there is the combined surface protection film and adhesive layer 2 with a formation of an opening 3. Next, the semiconductor wafer 1 is cut with a blade or other means along the dicing area D from the circuit side 1a side of the semiconductor wafer 1. It is also acceptable to fabricate multiple semiconductor chips 7 by cutting the semiconductor wafer 1 in this cutting process. The resulting chips will thus have a region, along their edges on the circuit side thereof, where the photosensitive protection layer and adhesion layer is not present, and a region over the bond pad the photosensitive combined protection layer and adhesion layer 2 is not present. Alternatively, the removal of the portion of the photosensitive combined protection layer and adhesion layer 2 layer overlying the bond pad may remain in place, and later removed in after the bonded to an underlying substrate or chip.

Next, as shown in FIG. 2A, the semiconductor wafer 1 that has undergone the processes from the formation process of the combined surface protection film and adhesive layer 2 to the cutting process, is prepared, that is, the semiconductor wafer 1 that has multiple semiconductor chips 7 adhered on the support sheet 8 is prepared. Multiple semiconductor chips 7 are sequentially picked up from the support sheet 8. Pickup of the semiconductor chip 7 is executed, for instance, after irradiating ultraviolet light to the support sheet 8, and the adhesive layer is allowed to cure to lower the adhesive force of the sheet to the chip. Then, the first semiconductor chip 7A is held by a suction collet 9 and picked up from the support sheet 8. The suction collet 9 has a suction side 9a for providing suction on the semiconductor chip 7 to releasingly hold it on the suction collet 9.

The first semiconductor chip 7A picked up from the support sheet 8 is carried to the mounting process of the next process. When mounting the first semiconductor chip 7A to the circuit substrate, as shown in FIG. 2B, the circuit substrate such as a wiring board 10 is placed on a stage (heating stage) 11 which has a heating mechanism. The circuit substrate mounted with the semiconductor chip 7 is not limited to the wiring board 10, the chip 7 may also be mounted to a lead frame. The first semiconductor chip 7A picked up from the support sheet 8 is disposed in a predetermined position of the wiring board 10 loaded on the heating stage 11. An adhesive layer 12 is located on the wiring board 10 at the position where the chips of the wiring board 10 are to be mounted. The adhesive layer 12 is formed by coating an adhesive film or otherwise adhering an adhesive film to the wiring board 10.

At the time of bonding the first semiconductor chip 7A to the wiring board 10, the wiring board 10 is preheated to the prescribed temperature by the heating stage 11. The heating temperature is set according to the bonding temperature of the adhesive layer 12. In the case the adhesive layer 12 is made of thermosetting resin, for instance, the thermosetting resin of the B stage is heated up to a temperature so that it is in a heated fluid state. The adhesive layer 12 on the wiring board 10 is heated to a prescribed temperature, and the first semiconductor chip 7A is bonded to the wiring board 10 by pressing the first semiconductor chip 7A against the adhesive layer 12 with the suction collet 9. After the semiconductor chip 7A is adhered to the wiring board 10, suction on the suction collet may be released, to release the semiconductor chip 7A from the suction collet 9.

Next, the second semiconductor chip 7B is bonded on top of the first semiconductor chip 7A as shown in FIG. 2C. First, identical with the process shown in FIG. 2A, the second semiconductor chip 7B is held by the suction collet 9 and picked up from the support sheet 8. The second semiconductor chip 7B picked up from the support sheet 8 is disposed to the predetermined position of the first semiconductor chip 7A. Bonding of the first semiconductor chip 7A with the second semiconductor chip 7B is performed by the first combined surface protection film and adhesive layer 2A which is formed on the circuit side of the first semiconductor chip 7A.

At the time of bonding the second semiconductor chip 7B onto the first semiconductor chip 7A, the first semiconductor chip 7A is heated up to the prescribed temperature by the heating stage 11 through the wiring board 10. The heating temperature is set according to the bonding temperature of the combined surface protection film and adhesive layer 2. When the combined surface protection film and adhesive layer 2 is made of thermosetting resin, for instance, the B stage thermosetting resin is heated to a temperature of liquid state. The first semiconductor chip 7A and the first combined surface protection film and adhesive layer 2A mounted on the wiring board 10 are being heated to the prescribed temperature, by pressing the second semiconductor chip 7B to the first surface protection film and adhesive layer 2A by the suction collet 9, the second semiconductor chip 7B is bonded to the first semiconductor chip 7A, and thereafter suction on the suction collet 9 may be released, releasing the semiconductor chip 7B from suction collet 9.

At the time of bonding the first semiconductor chip 7A and the second semiconductor chip 7B, bonding between the semiconductor chips 7A and 7B is improved by pressurizing while heating the first combined surface protection film and adhesive layer 2A. That is, wettability of the first combined surface protection film and adhesive layer 2A to the second semiconductor chip 7B is improved, and the bonding reliability between semiconductor chips 7A and 7B can be improved. The viscosity (viscosity when heated up) of the combined surface protection film and adhesive layer 2A is preferably in the range of 10 to 10000 Pa·s, and more preferably in the range of 10 to 3000 Pa·s. By pressing the semiconductor chip 7B against the combined surface protection film the adhesive layer 2A which has this viscosity at the time of bonding, bonding reliability between the semiconductor chips 7A and 7B can be improved.

Figure 5:
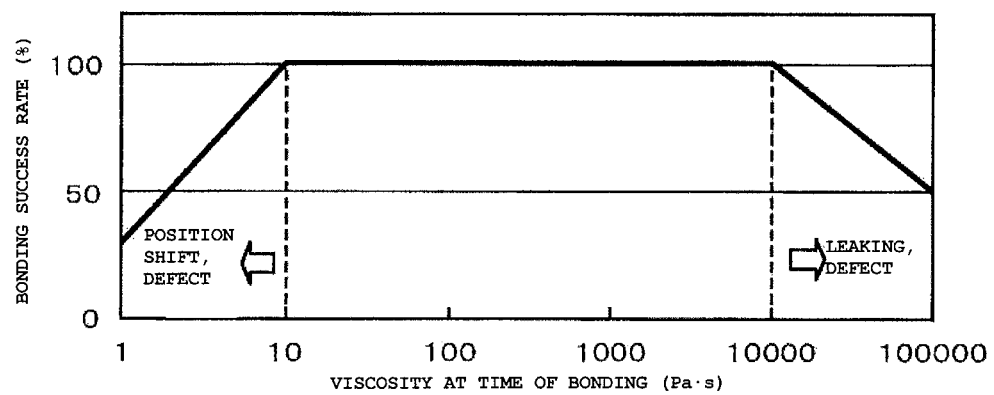
FIG. 5 is a diagram depicting an example of the relationship between the viscosity at time of adhesion of the surface protection film and adhesive layer and the success rate of adhesion between the semiconductor chips.

FIG. 5 shows the relation to bonding success rate (%) between semiconductor chips 7A and 7B with the viscosity at time of bonding of the combined surface protection film and adhesive layer 2A. It is clear from FIG. 5 that by heating the combined surface protection film and adhesive layer 2A, the viscosity will be 10000 Pa·s or less at the time of bonding; wettability to the semiconductor chip 7B of the combined surface protection film and adhesive layer 2A is improved; and bonding reliability between semiconductor chips 7A and 7B can be improved.

From the viewpoint of bonding reliability, it is preferable that viscosity at the time of bonding the combined surface protection film and adhesive layer 2A is 3000 Pa·s or less. However, if the viscosity at the time of bonding the combined surface protection film and adhesive layer 2A is too low, volatile elements such as solvents form bubbles and voids which might cause shifting of position and other issues to the semiconductor chip 7B, the viscosity at the time of bonding the combined surface protection film and adhesive layer 2A is preferably to be 10 Pa·s or more. Viscosity at the time of bonding of the surface protection film and the adhesive layer 2A is measured based on the viscosimetry provided in JIS K7244-10. In this case, the viscosity can be measured with dynamic viscoelasticity measuring equipment (parallel plate vibration rheometer).

The combined second surface protection film and adhesive layer 2B is formed on the surface of the second semiconductor chip 7B. Since the suction side 9a of the suction collet 9 comes into contact with the second combined surface protection film and adhesive layer 2B, due to the suction collet 9 and the state of the second combined surface protection film and adhesive layer 2B, the property of separation from the second semiconductor chip 7B of the suction collet 9 might be decreased. Poor separation of the suction collet 9 is a peculiar defect mode in the case of using the combined surface protection film and adhesive layer 2. That is, in the case of using the usual surface protection film (which is on the circuit side of the semiconductor chip) and the adhesive layer (which is on the non-circuit side), the suction collet shall not adhere to the surface protection film even when heated up at time of bonding.

The adhesion of the second semiconductor chip 7B on the suction side 9a of the suction collet 9 in this embodiment is lower than the adhesion between the first semiconductor chip 7A and the second semiconductor chip 7B. By using the suction collet 9 including the suction side 9a that is adhered to the second semiconductor chip 7B, and after bonding the first semiconductor chip 7A with the second semiconductor chip 7B, the occurrence of failure in separation of the suction collet 9, as it is in a state of bonding and difficult to separate from the second semiconductor chip 7B, needs to be prevented.

The suction side 9a of the suction collet 9 is generally formed by rubber. It is preferable that the adhesion to the semiconductor chip 7B on the rubber suction side 9a is lower than the adhesion between semiconductor chips 7A and 7B, and the suction side 9a may be formed by an elastomer whose surface tension is low, such as silicone rubber. Since the silicone rubber has excellent separation properties from the combined protection and adhesive film, poor separation of the chip 7 from the suction collet 9 can be ameliorated. In addition, the surface roughness of the rubber suction side 9a is preferably in the range of 0.1 to 100 μm by the average roughness Ra. By using the suction side 9a having such surface-roughness, suction of the semiconductor chip 7 is maintained, and the occurrence of problems in the separation of the suction collet 9 and semiconductor chip 7 can be reduced. The arithmetic mean roughness Ra of the rubber suction side 9a is measured on the basis of JIS B 0651-1976.

Figure 6:
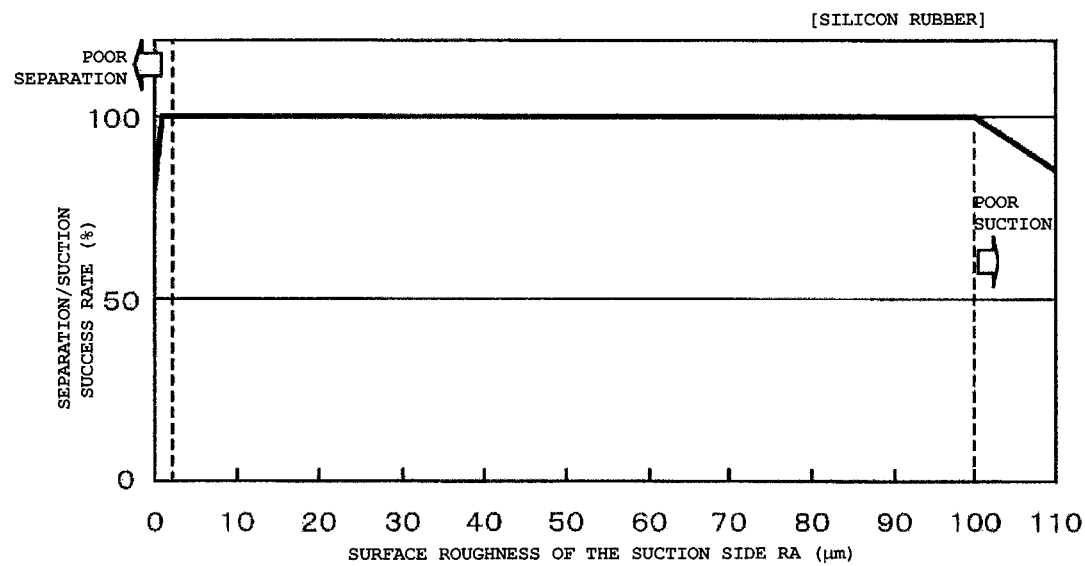
FIG. 6 is a diagram depicting an example of the relationship between the surface roughness Ra of the rubber suction surface of the suction collet and the separation probability rate of the suction collet and the suction success rate.

If the surface-roughness Ra of the rubber suction side 9a is less than 0.1 μm, adhesion to the semiconductor chip 7 would be too high, and this may cause separation problems of the suction collet 9. On the other hand, if the surface-roughness Ra on the rubber suction side 9a exceeds 100 μm, suction power of the semiconductor chip 7 might be lowered. FIG. 6 shows the relationship between the surface roughness Ra on the silicone rubber suction side 9a and the success rate in separation of the suction collet 9, and the success rate of the semiconductor chip 7. It is clear from FIG. 6 that by using the suction collet 9 having a rubber suction side 9a with the surface-roughness Ra in the range of 0.1 to 100 μm, defective separation of the suction collet 9 from the wafer 1 can be controlled while maintaining proper suction holding of the semiconductor chip 7. The surface-roughness Ra on the rubber suction side 9a of the suction collet 9 is preferably in the range of 1 to 2 μm.

Figure 7:
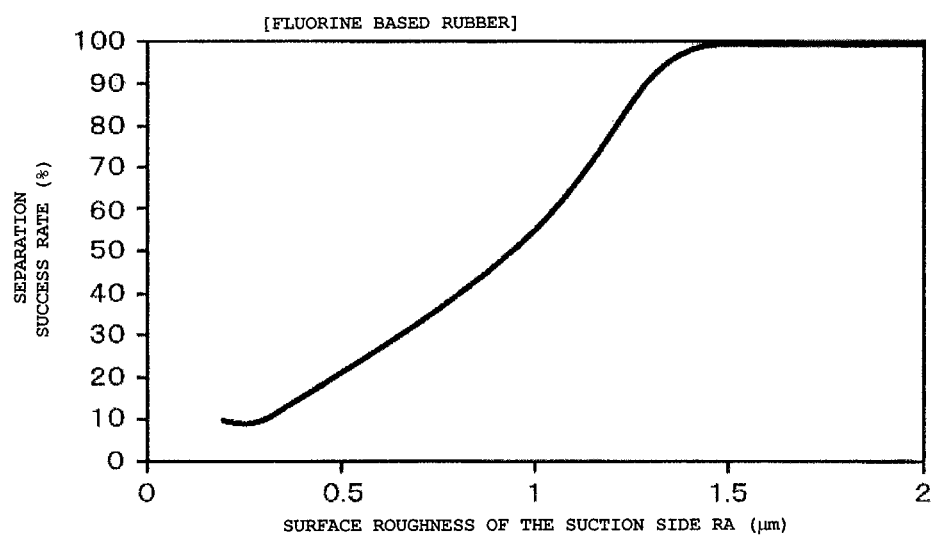
FIG. 7 is a diagram depicting another example of the relationship between the surface roughness Ra of the rubber suction surface of the suction collet and the separation probability rate of the suction collet.

It is more preferable that at least the suction side 9a of the suction collet 9 is made of silicone rubber, and the surface-roughness Ra on the suction side 9a is in the range of 0.1 to 100 μm. In addition, the shape of the suction side 9a in a convex curved shape is preferred. The suction side 9a in such a shape has low adhesion to the semiconductor chip 7B, and since the semiconductor chip 7B has excellent separation properties from the suction collet 9, it is capable of controlling the incidence of defective separation of the suction collet 9 more stably. Other rubber materials for formation of the suction side 9a include fluorine based rubber (polytetrofluoroethylene, etc.), acrylic rubber and urethane rubber, etc. The surface-roughness Ra on the suction side 9a made of these rubber materials is in the range of 0.1 to 100 μm, and separation of the suction collet 9 can be improved. FIG. 7 shows the relationship between surface-roughness Ra on the fluorine based rubber suction side 9a and the rate of success of separation of the suction collet 9. In this case, surface-roughness Ra on the fluorine based rubber side 9a is preferably in the range of 1 to 2 μm.

In addition, the rubber hardness of the rubber suction side 9a of the suction collet 9 is preferably in the range of 30 to 100, measured based on the vulcanized rubber and thermoplastic rubber hardness test method according to JIS K-6253. The performance of separation of the suction collet 9 can be further improved with adoption of the rubber suction side 9a with this degree of hardness. That is, if the rubber hardness on the rubber suction side 9a is 30 or more, separation of the suction collet 9 can be improved. However, if the degree of rubber hardness on the rubber suction side 9a is too high, the ability to conform the suction side 9a material to the semiconductor chip 7 decreases, thus the rubber hardness on the rubber suction side 9a is preferably 100 or less. The rubber hardness on the rubber suction side 9a is preferably in the range of 50 to 80.

It is also effective to perform a surface treatment on the suction side 9a of the suction collet 9 to lower the surface energy of the silicone resin coating. A fluorine based resin coating and a tosical (TM by Tokyo-Silicone) coating, etc. can be used as a surface treatment on the silicone resin coating. The suction side 9a of the suction collet 9 has a preferable contact angle in the range of 90 to 170 degrees to pure water. By using the suction side 9a having such a contact angle, separation of the suction collet 9 can be improved with excellent reproducibility. The contact angle of pure water on the suction side 9a is preferably in the range of 110 to 150 degrees.

In addition, after bonding the first semiconductor chip 7A and the second semiconductor chip 7B, scrubbing treatment of the suction collet 9 is carried out in the width of 0.1 to 50 μm, as an example, when raising the suction collet 9, and it is also effective to conduct the treatment of rapid cooling by blowing cooling air such as high pressure air onto the suction collet 9. Separation of the suction collet 9 can be further improved by carrying out these treatments. The scrubbing treatment and rapid cooling treatment of the suction collet 9 may be executed individually or in combination.

Figure 8:
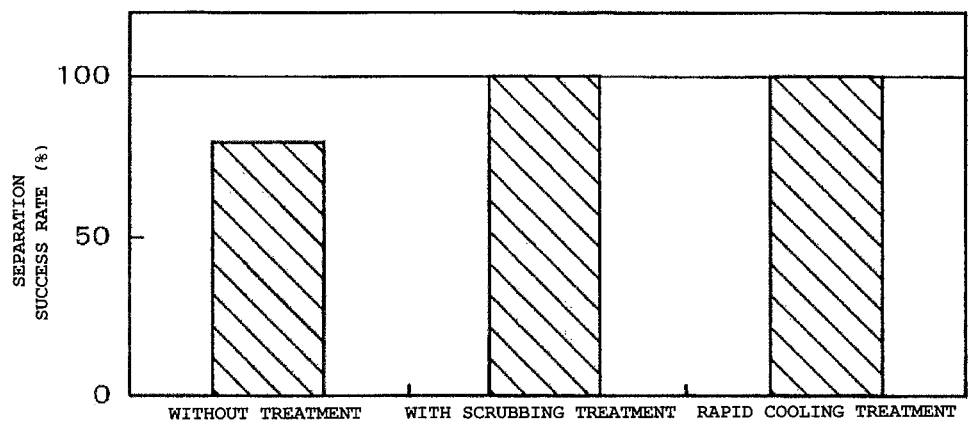
FIG. 8 is a diagram depicting the relationship between the process at the time of lifting the suction collet and the rate of probability of separation of the suction collet.

The success rate of separation of the suction collet 9 when carrying out the scrubbing treatment when raising the suction collet 9, the success rate of separation of the suction collet 9 when carrying out the rapid cooling treatment, and the success rate of separation of the suction collet 9 without conducting these treatments are shown in FIG. 8. The rubber suction side 9a of the suction collet 9 is made of silicon rubber for all cases, and the surface roughness Ra is 0.2 μm. It is clear from FIG. 8 that by carrying out the scrubbing treatment and rapid cooling treatment when raising the suction collet 9, the success rate of separation of the suction collet 9 from the semiconductor chip 7 is further improved.

The bonding process of the semiconductor chip 7 is repeatedly carried out according to the number of stacked semiconductor chips 7. That is, the pickup stage of the semiconductor chip shown in FIG. 2A and the bonding process of the semiconductor chip 7 shown in FIG. 2C are repeatedly executed, and the required number of semiconductor chips 7 are stacked on the wiring board 10. FIG. 4 shows the state of stacking 1st through 5th semiconductor chips 7A to 7E on the wiring board 10. The 1st through the 5th semiconductor chips 7A to 7E are stacked on the wiring board 10 in stages while ensuring exposure of the respective electrode pad 4. The electrode pad 4 with the 1st through the 5th semiconductor chips 7A to 7E is electrically connected with the connecting pad (connection part) 13 of the respective wiring substrate 10 through a metal wire 14. The connection of the electrode pad 4 and the connection pad 13 maybe conducted by printing a wiring layer with the conductive resin or other materials in place of a metallic wire 14. At the time of conducting the wire bonding to the semiconductor chips 7A to 7E, it is preferably to conduct a pretreatment of the curing process to the surface protection film and adhesive layer 2 on each chip 7A to 7E to provide for curing. As a result, the wire bonding can be improved. It is preferable that curing treatment of the surface protection film and adhesive layer 2 is conducted after stacking the required number of semiconductor chips 7A to 7E. It is preferable that wire bonding to the semiconductor chips 7A to 7E is conducted to the semiconductor chips 7A to 7E having undergone the curing treatment of the surface protection film and adhesive layer 2.

It is preferable that the storage modulus of the surface protection film and adhesive layer 2, after treatment of curing has the curing treatment at 175° C., is 40 MPa or above. The surface protection film and adhesive layer 2 softens by pressurizing and heating at the time of wire bonding. In this case, if the storage modulus is less than 40 MPa at 175° C., the semiconductor chip 7 bends, this may cause poor bonding and cracking of the chip. That is, by using the surface protection film and adhesive layer 2 with storage modulus at 40 MPa or more at 175° C., bonding reliability can be improved through wire bonding. The storage modulus of the surface protection film and adhesive layers 2 at 175° C. is measured in accordance with JIS K7244-4 "Test method of plastic and dynamic mechanical property".

Furthermore, it is preferable that the storage modulus of the surface protection film and adhesive layer 2 at 260° C. is 2 MPa or more after having undergone the curing treatment. It is preferable the die shear strength with the semiconductor chip 7 is 0.6 MPa or more at 260° C., and it is preferably that water absorption at the storage temperature of 85° C. and relative moisture of 85% is 0.8% or below. Thus reliability of the surface protection film and adhesive layer 2 in the solder reflow process can be improved. That is, at the time of reflow test for evaluating reflow resistance (carried out under 260° C. vapor pressure), interfacial peeling of the adhesive agent from the chip and cohesive failure of the adhesive agent can be controlled, and it is preferable the three conditions are satisfied: These three conditions are measured in accordance with JIS K7244-4 "Test method of plastic and the dynamic mechanical properties".

After connecting the electrode pad 4 with the semiconductor chips 7A to 7E and the connecting pad 13 of the wiring board 10 electrically with a metallic wire 14 and other means, by sealing of the semiconductor chips 7A to 7E with a sealing resin layer 15, the semiconductor package 16 is fabricated. An external electrode is provided by solder bumps (not shown) on the lower side of the wiring board 10. Various well-known configurations can be applied to the semiconductor package 16. For instance, the circuit substrate for mounting the semiconductor chip 7 may be a lead frame instead of the wiring board 10.

According to the fabrication process of the first embodiment, when the surface protection film and adhesive layer 2 is used, the common stacking process that picks up and stacks the semiconductor chips 7 from the semiconductor wafer 2 is applied. This method enables fabrication of the stacked semiconductor devices with excellent reliability and good yield. That is, while maintaining bonding reliability between the semiconductor chips 7, the occurrence of defects by poor separation from the semiconductor chip 7 of the suction collet 9 can be controlled. In addition, the thickness of the stacked semiconductor device can be reduced by using the surface protection film as the adhesive layer, and vice versa. The 1st through 5th semiconductor chips 7A to 7E are stacked on the wiring board 10 in order in the first embodiment, but the number of stacked semiconductor chips 7 is not limited to this, it is acceptable that at least one semiconductor chip 7 is stacked on the semiconductor chip 7A mounted on the circuit substrate.

(Embodiment 2)

Figure 9:
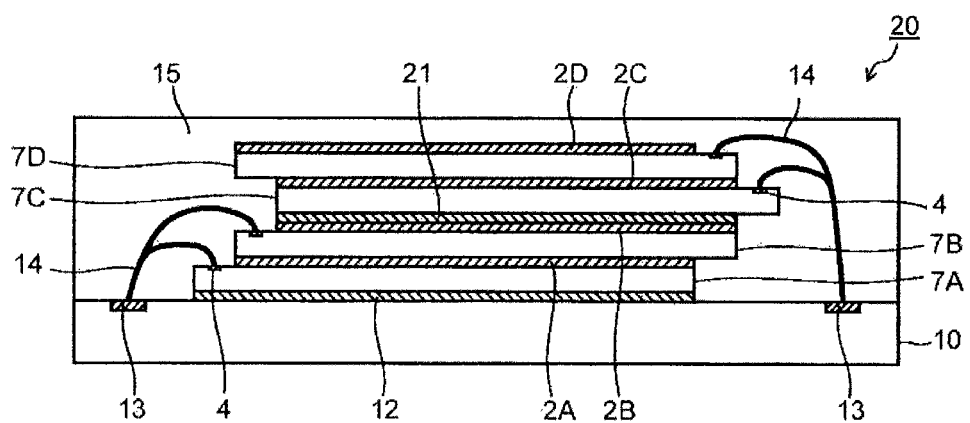
FIG. 9 is a cross section depicting a semiconductor package fabricated by adopting the fabrication method of the stacked semiconductor device according to the second embodiment.

FIG. 9 is a cross-sectional view showing the semiconductor package fabricated by applying the fabrication process of the stacked semiconductor device of the second embodiment. The semiconductor package 20 shown in FIG. 9 is fabricated and picked up identically with the first embodiment, and the 1st through 4th semiconductor chips 7A to 7D are stacked on the wiring board 10 in order. However, the stage direction of the first and second semiconductor chips 7A and 7B, and the third and fourth semiconductor chips 7C and 7D are in the opposite direction of each other. The first and second semiconductor chips 7A and 7B are stacked up on the wiring substrate 10 in order in a stage state. The third and fourth semiconductor chips 7C and 7D are stacked up on second semiconductor chip 7B and the first and the second semiconductor chips 7A and 7B are stacked in the opposite direction in order.

The first through the fourth semiconductor chips 7A to 7D all have the identical configuration with the semiconductor chip 7 in the first embodiment. That is, the respective first through the fourth combined surface protection film and adhesive layers 2A to 2D are provided to the circuit side of the first through the fourth semiconductor chips 7A to 7D. The specific configuration of the combined surface protection film and adhesive layer 2A to 2D is identical with the first embodiment. In addition, an opening for exposure of the electrode pad is provided to the first through the fourth combined surface protection film and adhesive layers 2A to 2D, in the exposure/development processes (FIG. 1A and FIG. 1B) of the wafer stage.

Figure 10A:
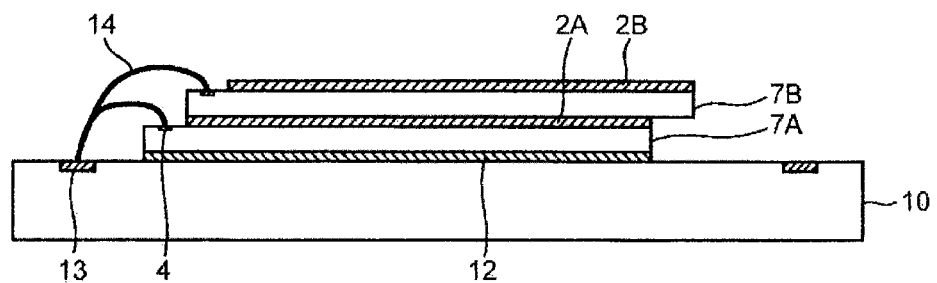
FIGS. 10A to 10C are cross sections depicting the process of adhering the semiconductor chips in the fabrication method of the stacked semiconductor device according to the second embodiment.

The fabrication process of the semiconductor package 20 shown in FIG. 9 is described with reference of FIGS. 10A to 10C. First, as shown in FIG. 10A, the process similar to FIG. 2A to FIG. 2C is performed. The first and the second semiconductor chips 7A and 7B are stacked onto the wiring substrate 10 in a stage-like state in order. Next, wire bonding is conducted to the electrode pads 4 of the first and second semiconductor chips 7A and 7B. The electrode pad 4 and the connecting pad 13 of the wiring board 10 are connected through a metallic wire 14 electrically. In this case, the first surface protection film and the adhesive layer 2A is pretreated by curing before the wire bonding process to improve the wire bonding performance.

If the curing treatment is carried out after stacking the first and the second semiconductor chips 7A and 7B, the second combined surface protection film and adhesive layer 2B is also cured, and the bonding property is compromised. Moreover, even if the curing process is not to be carried out before the wire bonding process, the thermal history in the wire bonding process promotes curing, and bonding properties might be compromised.

Figure 10B:
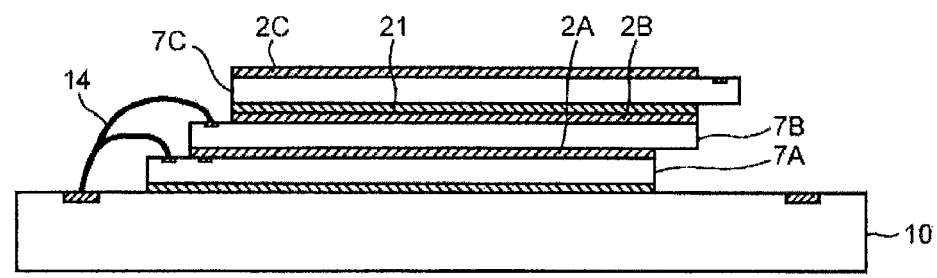

As shown in FIG. 10B, after formation of an adhesive layer 21 on the second surface protection film and adhesive layer 2B, the third semiconductor chip 70 is stacked up. The adhesive layer 21 is formed by coating an adhesive agent including thermosetting resin on the second surface protection film and the adhesive layer 2B, and adhering an adhesive film. Even though the stage direction of the stacked chips is in the opposite direction when the adhesive layer 21 is applied, wire bonding properties are maintained, and reliability between the semiconductor chips 7 can be improved.

After the third semiconductor chip C is picked up from the support sheet 8 held by the suction collet 9, identical with the process shown in FIG. 2A, it is disposed to the predetermined position of the second semiconductor chip 7B. On the third semiconductor chip 7C, the position of the electrode pad 4 is disposed in the opposite direction with the second semiconductor chip 7B. Bonding of the second semiconductor chip 7B and the third semiconductor chip 7C is carried out by an adhesive layer 21 formed on the second combined surface protection film and adhesive layer 2B. The bonding process is similar to the first embodiment. The second semiconductor chip 7B is heated up to the predetermined temperature, and the third semiconductor chip 7C is pressed by a suction collet 9 to the adhesive layer 21, and the third semiconductor chip 7C is bonded to the second semiconductor chip 7B.

Figure 10C:
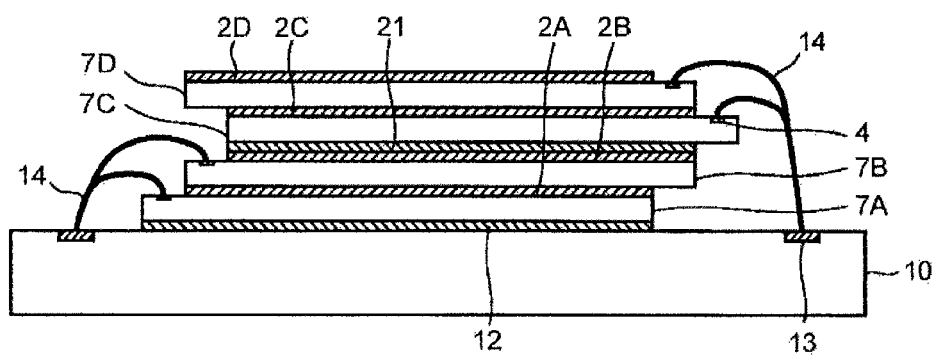

Next, the fourth semiconductor chip 7D is bonded on the third semiconductor chip 7C as shown in FIG. 10C. Bonding of the third semiconductor chip 7C with the fourth semiconductor chip 7D is executed by the third combined surface protection film and adhesive layer 2C formed on the circuit side of the third semiconductor chip 7C. The fourth semiconductor chip 7D is disposed so that the position of the electrode pad 4 is in the same direction with the third semiconductor chip 7C. The bonding process is similar to the first embodiment. After the third and fourth combined surface protection film and adhesive layer 2C and 2D have undergone the curing treatment, wire bonding is executed to the electrode pad 4 of the third and fourth semiconductor chip 7C and 7D.

Similar to the semiconductor package 16 shown in FIG. 4, the semiconductor chips 7A to 7D are sealed by a sealing resin layer 15 together with the metallic wire 14, and the semiconductor package 20 shown in FIG. 9 is fabricated. The external electrode is provided to the lower side of the wiring substrate 10 by solder bumps not shown. The configuration of two stacked chips stacked of the semiconductor chips 7 in the same direction is shown in FIG. 9 and FIG. 10, and it shows the state that these two stacked chips are stacked in the manner so that the stage direction is in the opposite direction. There is no restriction on the number of semiconductor chips making up the chip stack or the number of stacks, as long as there is more than one chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A fabrication method of providing stacked semiconductor devices from a semiconductor wafer having multiple chip areas and dicing areas, comprising the steps of:
   forming a surface protection and adhesive layer onto a circuit side of the semiconductor wafer;
   forming an opening through the surface protection and adhesive layer to expose respective electrode pads on the circuit side of the multiple chip areas and the dicing areas;
   partitioning the semiconductor wafer into a plurality of individual chips that include first and second semiconductor chips;
   positioning a non-circuit side of the semiconductor wafer on a support sheet;
   holding a first semiconductor chip on a suction collet and removing the first semiconductor chip from the support sheet, positioning the first semiconductor chip on an adhesive layer of a receiving substrate, and heating the receiving substrate to bond the first semiconductor chip to the receiving substrate; and
   holding a second semiconductor chip on the suction collet and removing the second semiconductor chip from the support sheet, positioning the second semiconductor chip directly on the surface protection and adhesive layer of the first semiconductor chip, and bonding the first semiconductor chip to the second semiconductor chip, wherein
   the suction collet has a suction side with lower adhesion to the surface protection and adhesive layer than that between the first semiconductor chip and the second semiconductor chip.

2. The fabrication method of stacked semiconductor devices according to claim 1, wherein
   the suction side of the suction collet is made of silicon rubber, and
   the surface roughness of the suction face is in the range of 0.1 to 100 μm with arithmetic average roughness Ra.

3. The fabrication method of stacked semiconductor devices according to claim 1, wherein
   at the time of raising the suction collet after bonding the first semiconductor chip to the second semiconductor chip, at least one of scrubbing the suction collet and rapid cooling by blowing cooling air to the suction collet is executed.

4. The fabrication method of stacked semiconductor devices according to claim 1, wherein
   the step of partitioning the semiconductor wafer comprises the steps of:
   forming a ditch along the dicing areas,
   adhering a protection tape to the circuit side of the semiconductor wafer,
   grinding the non-circuit side of the semiconductor wafer to partition the semiconductor wafer into the plurality of individual chips,
   adhering the support sheet to the non-circuit side of the semiconductor wafer, and
   peeling off the protection tape.

5. The fabrication method of claim 1, wherein the suction collet has an elastomeric surface, and said elastomeric surface has a hardness in the range of 30 to 100, measured based on the vulcanized rubber and thermoplastic rubber hardness test method according to JIS K-6253.

6. The fabrication method of claim 1, wherein the suction collet has an elastomeric surface, and said elastomeric surface has a contact angle in the range of 90 to 170 degrees to pure water.

7. The fabrication method of claim 1, wherein the suction collet has an elastomeric surface, and said elastomeric surface has a fluorine based resin coating thereon.

8. The fabrication method of claim 1, further including the step of electrically connecting a connecting part of the receiving substrate and the electrode pads of the first and second semiconductor chips.

9. The fabrication method of claim 1, further including, prior to the step of forming the ditch in the semiconductor wafer, the steps of:
   selectively exposing portions of the surface protection and adhesive layer to light;
   developing the exposed portions of the surface protection and adhesion layer to remove portions of the surface protection and adhesive layer overlying the area of the ditch to be formed.

10. The fabrication method of claim 9, further including exposing the electrode pads on the circuit side of the multiple chip areas when removing portions of the surface protection and adhesive layer.

11. The method of claim 10, further including the step of electrically interconnecting at least one bond at a location where the surface protection and adhesive layer is not present on at least one of the first and the second semiconductor chips to the underlying support sheet.

12. A manufacturing apparatus of semiconductor devices comprising:
    a pickup section configured to sequentially pick up a plurality of semiconductor chips formed on a semiconductor wafer including:
    a first semiconductor chip where a first photosensitive surface protection film and adhesive layer is formed on a circuit side thereof, and
    a second semiconductor chip where a second photosensitive surface protection film and adhesive layer is formed on a circuit side thereof, and
    a chip bonding section where the first semiconductor chip picked up by the suction collet is to be bonded to a substrate, and
    the second semiconductor chip picked up by the suction collet is disposed onto the first semiconductor chip and directly bonded to the first semiconductor chip by the first photosensitive surface protection film and adhesive layer,
    wherein the suction collet has lower adhesion to the either of the first and second photosensitive surface protection film and adhesive layers than that between the first and second semiconductor chips.

13. The manufacturing apparatus of semiconductor devices according to claim 12, wherein the suction collet has an elastomeric surface, and said elastomeric surface has a hardness in the range of 30 to 100, measured based on the vulcanized rubber and thermoplastic rubber hardness test method according to JIS K-6253.

14. The manufacturing apparatus of semiconductor devices according to claim 12, wherein the suction collet has an elastomeric surface, and said elastomeric surface has a contact angle in the range of 90 to 170 degrees to pure water.

15. The manufacturing apparatus of semiconductor devices according to claim 12, wherein the suction collet has an elastomeric surface, and said elastomeric surface has a fluorine based resin coating thereon.

\* \* \* \* \*